(12) United States Patent
Park

(10) Patent No.: US 9,230,670 B2
(45) Date of Patent: Jan. 5, 2016

(54) SEMICONDUCTOR DEVICE, MEMORY SYSTEM AND OPERATING METHOD THEREOF

(71) Applicant: SK hynix Inc., Icheon-si Gyeonggi-do (KR)

(72) Inventor: Jong Won Park, Gimpo-si (KR)

(73) Assignee: SK Hynix Inc., Gyeonggi-do (KR)

( * ) Notice: Subject to any disclaimer, the term of this patent is extended or adjusted under 35 U.S.C. 154(b) by 151 days.

(21) Appl. No.: 14/191,637

(22) Filed: Feb. 27, 2014

(65) Prior Publication Data

US 2015/0070988 A1 Mar. 12, 2015

(30) Foreign Application Priority Data

Sep. 10, 2013 (KR) ........................ 10-2013-0108571

(51) Int. Cl.
| | |
|---|---|
| *G11C 16/26* | (2006.01) |
| *G11C 29/00* | (2006.01) |
| *G11C 16/04* | (2006.01) |
| *G06F 11/10* | (2006.01) |
| *G06F 11/14* | (2006.01) |
| *G11C 11/56* | (2006.01) |

(52) U.S. Cl.
CPC ............ *G11C 16/26* (2013.01); *G06F 11/1072* (2013.01); *G06F 11/1402* (2013.01); *G11C 11/5642* (2013.01); *G11C 16/0483* (2013.01); *G11C 29/70* (2013.01)

(58) Field of Classification Search
CPC ........... G11C 11/5642; G11C 16/0483; G11C 16/26; G11C 29/70; G06F 11/1072; G06F 11/1402

See application file for complete search history.

(56) References Cited

U.S. PATENT DOCUMENTS

| | | | | |
|---|---|---|---|---|
| 7,849,383 | B2 * | 12/2010 | Lin ..................... | G06F 11/1702 365/220 |
| 8,804,435 | B2 * | 8/2014 | Matsunaga ........ | G11C 16/3404 365/185.23 |
| 2013/0080858 | A1 * | 3/2013 | Lee ..................... | G11C 16/349 714/773 |
| 2014/0063967 | A1 * | 3/2014 | Ahn ....................... | G11C 16/26 365/185.18 |

FOREIGN PATENT DOCUMENTS

KR 1020130034522 A 4/2013

* cited by examiner

*Primary Examiner* — Harry W Byrne
*Assistant Examiner* — Lance Reidlinger
(74) *Attorney, Agent, or Firm* — William Park & Associates Ltd.

(57) ABSTRACT

There are a semiconductor device including: a plurality of memory blocks including a plurality of pages; peripheral circuits configured to perform a least significant bit read operation and a most significant bit read operation of a selected page included in a selected block; and a control circuit including a least significant bit read-retry table and a most significant bit read-retry table which have a plurality of indexes, and configured to control the peripheral circuits to store an index used when error correction is possible among the least significant bit read-retry table in the least significant bit read operation and perform the most significant bit read operation by first selecting the stored index among the most significant bit read-retry table.

15 Claims, 5 Drawing Sheets

| LSB R.R.T. | |
|---|---|
| INDEX | R2 |
| 0 | Vr2_0 |
| 1 | Vr2_1 |
| 2 | Vr2_2 |
| ⋮ | ⋮ |
| i | Vr2_i |

| MSB R.R.T. | | |
|---|---|---|
| INDEX | R1 | R3 |
| 0 | Vr1_0 | Vr3_0 |
| 1 | Vr1_1 | Vr3_1 |
| 2 | Vr1_2 | Vr3_2 |
| ⋮ | ⋮ | ⋮ |
| i | Vr1_i | Vr3_i |

SEMICONDUCTOR DEVICE, MEMORY SYSTEM AND OPERATING METHOD THEREOF

CROSS-REFERENCE TO RELATED APPLICATION

The present application claims priority under 35 U.S.C 119(a) to Korean Patent Application No. 10-2013-0108571, filed on Sep. 10, 2013, in the Korean Intellectual Property Office, which is incorporated herein by reference in its entirety as set forth in full.

BACKGROUND

1) Field of the Invention

The invention relates to a semiconductor device, a memory system and an operating method thereof, and more specifically, to a read operation of a semiconductor device.

2) Discussion of Related Art

A semiconductor device includes a memory cell array configured to store data. The memory cell array includes a plurality of memory blocks, and each of the memory blocks includes a plurality of memory cells storing data. Among semiconductor devices, a non-volatile memory device is in that data stored in the memory cells is retained even when power is cut off. However, as the number of memory cells storing data and a degree of integration of semiconductor devices are increasing, a distance between the memory cells is becoming narrower, and thus the memory cells in which a program is already completed may interfere during a program operation of adjacent memory cells. Thus, data of the memory cells may be distorted when the memory cells having completed the program are read later, and thus reliability of the semiconductor device and an operation of the semiconductor device may be reduced.

SUMMARY

The invention is directed to a semiconductor device, a memory system and an operating method thereof capable of improving reliability of a read operation.

An aspect of the invention provides a semiconductor device including: a plurality of memory blocks including a plurality of pages; peripheral circuits configured to perform a least significant bit read operation and a most significant bit read operation of a selected page included in a selected block; and a control circuit including a least significant bit read-retry table and a most significant bit read-retry table which have a plurality of indexes, and configured to control the peripheral circuits to store an index used when error correction is possible among the least significant bit read-retry table in the least significant bit read operation and perform the most significant bit read operation by first selecting the stored index among the most significant bit read-retry table.

An aspect of the invention provides a memory system including: a memory controller configured to output control signals through a plurality of pins; a memory interface configured to output interface signals including a command signal and an address; and a memory storage unit including a memory device in which data is stored, wherein the semiconductor device includes a control circuit configured to store an index when error correction is possible in a least significant bit read operation, and first select an index of a most significant bit read-retry table corresponding to the stored index in a most significant bit read operation.

An aspect of the invention provides an operation method of a semiconductor device including: performing a least significant bit read operation while selecting least significant bit read voltages included in a least significant bit read-retry table until error correction of least significant bit read data is possible; storing an index among the least significant bit read voltages when the error correction is possible; and performing a most significant bit read operation while selecting most significant bit read voltages corresponding to the stored index among a most significant bit read-retry table until error correction of most significant bit read data is possible.

An aspect of the invention provides a semiconductor device including: peripheral circuits configured to perform a least significant bit read operation and a most significant bit read operation in a selected block among a plurality of memory blocks; and a control circuit configured to control the peripheral circuits to store an index when error correction is possible among a least significant bit read-retry table and perform the most significant bit read operation by first selecting the index corresponding to the stored index among indexes of a most significant bit read-retry table.

BRIEF DESCRIPTION OF THE DRAWINGS

The above and other features and advantages of the invention will become more apparent to those of ordinary skill in the art by describing in detail various embodiments thereof with reference to the attached drawings in which.

DETAILED DESCRIPTION OF THE EMBODIMENTS

The invention will be described more fully hereinafter with reference to the accompanying drawings, in which embodiments of the invention are shown. This invention may, however, be embodied in different forms and should not be construed as limited to the embodiments set forth herein.

Figure 1:
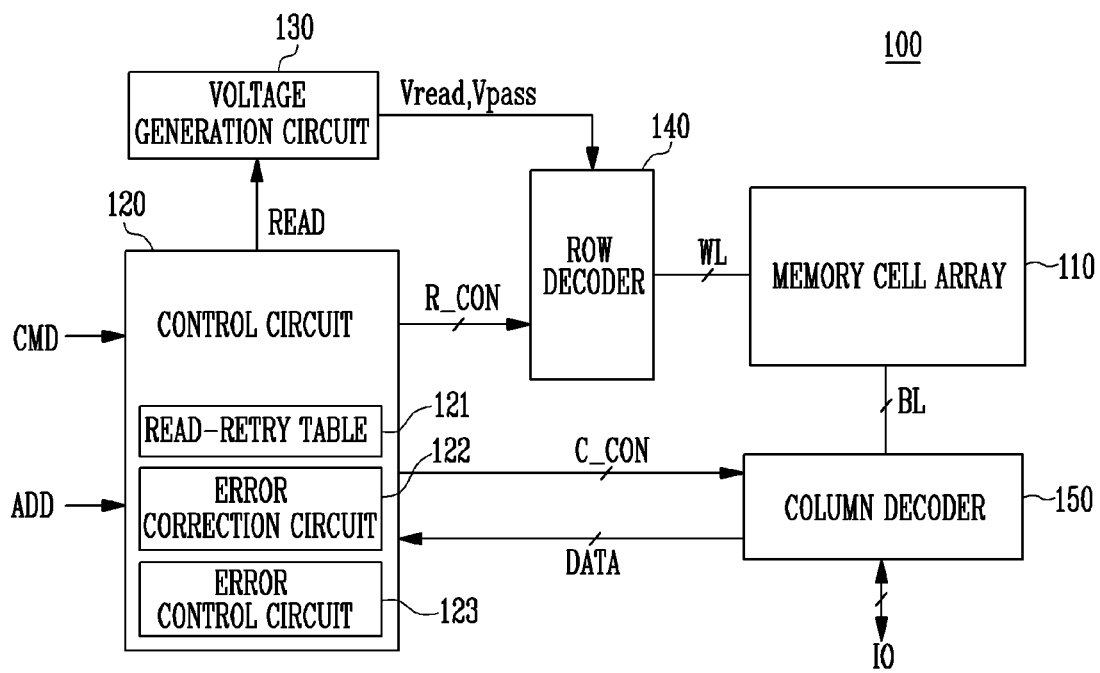
FIG. 1 is a block diagram illustrating a semiconductor device according to an embodiment of the invention.

FIG. 1 is a block diagram illustrating a semiconductor device according to an embodiment of the invention.

Referring to FIG. 1, a semiconductor device 100 includes a memory cell array 110 configured to store data, peripheral circuits 130, 140 and 150 configured to program, read and erase data into/from the memory cell array 110, and a control circuit 120 configured to control the peripheral circuits 130, 140 and 150. The peripheral circuits 130, 140 and 150 include a voltage generation circuit 130, a row decoder 140, and a column decoder 150. As an example of a read operation, circuit functions configuring the semiconductor device 100 will be described below.

The memory cell array 110 includes a plurality of memory blocks which may include a plurality of pages. The peripheral circuits 130, 140, and 150 may be configured to perform a least significant bit read operation a most significant bit read operation of a selected page in a selected block among the memory blocks.

The control circuit 120 outputs a read operation signal READ, row control signals R_CON and column control signals C_CON in response to a read command signal CMD and an address ADD. The row control signals R_CON may include row addresses. The column control signals C_CON may include column addresses and page buffer control signals.

In particular, the control circuit 120 includes a read-retry table 121, an error correction circuit 122 and an error control circuit 123.

The read-retry table 121 is stored in a storage unit included in the control circuit 120, and includes indexes for read voltages having various levels. The error correction circuit 122 is configured to detect and correct a read error included in read data DATA. The error control circuit 123 selects an index stored in read-retry table 121 in response to an error correction signal transmitted from the error correction circuit 122, and is configured to perform a read-retry algorithm using a read voltage corresponding to the selected index. Accordingly, the control circuit 120 may be configured to include a least significant bit read-retry table and a most significant bit read-retry table which have a plurality of indexes configured with various read voltages; and may be configured to control the peripheral circuits 130, 140, and 150 to store an index used when error correction is possible among the indexes of the least significant bit read-retry table in the least significant bit read operation; and perform the most significant bit read operation by first selecting an index corresponding to the stored index among the indexes of the most significant bit read-retry table. Further, the indexes of the least significant bit read-retry table may be configured with different least significant bit read voltages; and the indexes of the most significant bit read-retry table may be configured with most significant bit read voltages. In addition, the error control circuit 123 may be configured to select an index of the least significant bit read-retry table or the most significant bit read-retry table of the selected page in response to a signal output from the error correction circuit 122; and perform the least significant bit read operation or the most significant bit read operation using the least significant bit read voltage or the most significant bit read voltage corresponding to the selected index. A first index of the least significant bit read-retry table may be first selected in a least significant bit read-retry operation.

The voltage generation circuit 130 generates a read voltage Vread and a read pass voltage Vpass in response to the read operation signal READ output from the control circuit 120

The row decoder 140 selects one of memory blocks included in the memory cell array 110 in response to the row control signals R_CON output from the control circuit 120, and transmits the read voltage Vread and the read pass voltage Vpass to word lines WL of a selected memory block.

The column decoder 150 exchanges data with the memory cell array 110, or exchanges input/output data IO with the outside through bit lines BL coupled to the memory blocks in response to the column control signal C_CON. Accordingly, the column decoder 150 may be configured to exchange data with a selected memory block through bit lines coupled to the selected memory block in response to the column control signal C_CON output from the control circuit 120. In addition, in the read operation, the column decoder 150 transmits data DATA received from the memory cell array 110 to the control circuit 120. The control circuit 120, as described above, detects whether an error is included in the received data DATA, and controls the peripheral circuits 130, 140 and 150 to perform a next read operation.

Figure 2:
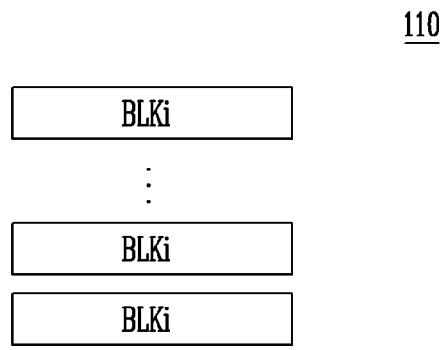
FIG. 2 is a block diagram illustrating a memory cell array shown in FIG. 1.

FIG. 2 is a block diagram illustrating a memory cell array shown in FIG. 1.

Referring to FIG. 2, the memory cell array 110 includes a plurality of memory blocks (BLK1~BLKi; here i is a positive integer). The memory blocks BLK1~BLKi share bit lines (BL of FIG. 1), and are coupled to different word lines (WL of FIG. 1). The memory blocks BLK1~BLKi are configured with the same structure.

Figure 3:
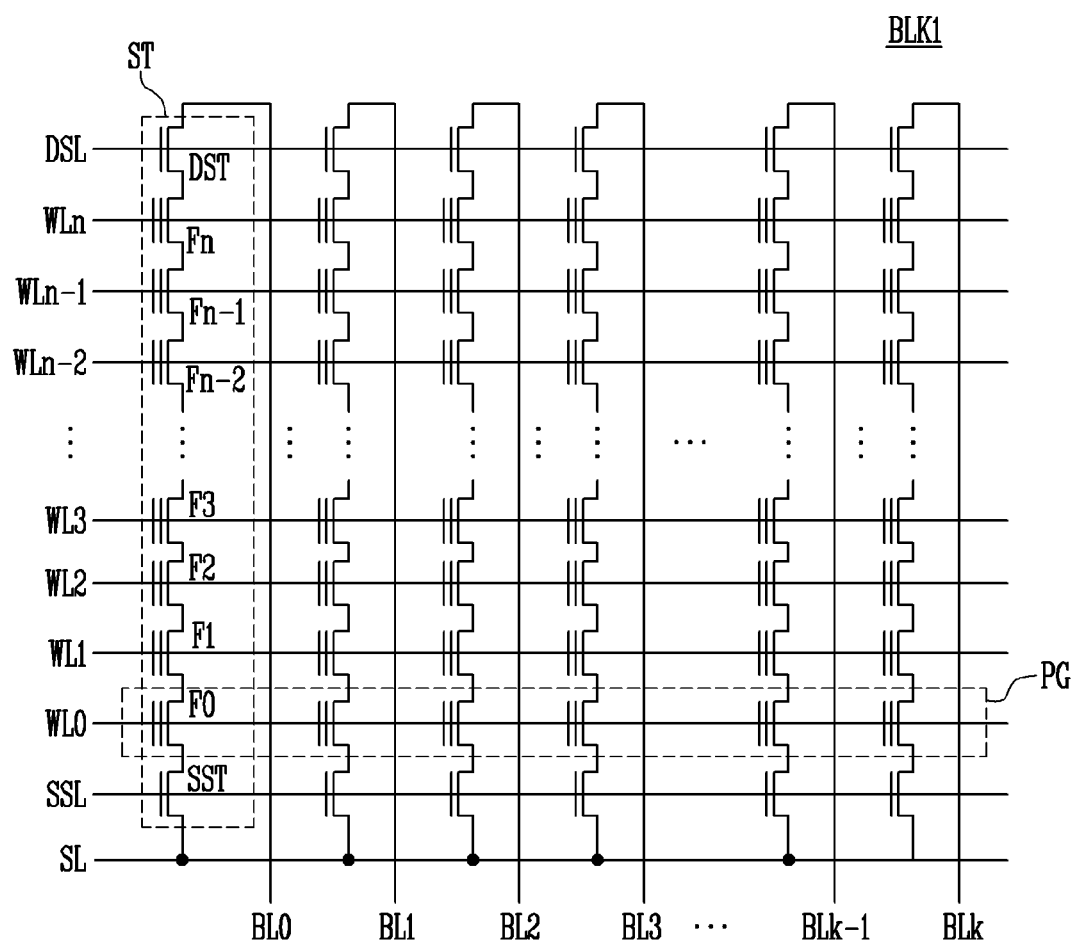
FIG. 3 is a circuit diagram illustrating a memory block shown in FIG. 2.

FIG. 3 is a circuit diagram illustrating the memory block shown in FIG. 2.

Referring to FIG. 3, the memory block BLK1 includes a plurality of cell strings ST coupled to bit lines BL0~BLk. The cell strings ST are configured with the same structure. As a specific example of a cell string ST located in the first row, the cell string ST includes a drain select transistor DST, a plurality of memory cells F0~Fn and a source select transistor SST coupled in series. A drain of the drain select transistor DST is coupled to a bit line BL0, and a source of the source select transistor SST is coupled to a common source line SL.

Gates of the drain select transistors DST included in different cell strings are commonly coupled to a drain select line DSL, gates of the memory cells F0~Fn are commonly coupled to word lines WL0~WLn, and gates of the source select transistors SST are commonly coupled to a source select line SST. Sources of the source select transistors SST included in the cell strings are commonly coupled to the common source line SL.

A group of memory cells coupled to the same word line is called a page PG. Thus, when one cell string ST includes N (here N is a positive integer) memory cells, a corresponding memory block includes N pages PG.

The read operation is performed in units of pages PG in a fixed order, but a selected page PG order may be varied depending on a semiconductor device. For example, the read operation is sequentially selected from a page PG coupled to the zeroth word line WL0 to a page PG coupled to the nth word line WLn, or adjacent pages may be alternately selected. Recently, a program method of a multi level cell (MLC) in which one memory cell is programmed to have threshold voltages of various levels is used, and thus the read operation is divided into a least significant bit (hereinafter, LSB) read operation and a most significant bit (hereinafter, MSB) read operation. For example, the read operation for a page PG is performed in a manner in which the LSB read operation is performed first and the MSB read operation is performed next. The order of the LSB read operation and the MSB read operation may be varied depending on a semiconductor device. The read operation according to an embodiment of the invention may be applied to all read operations of selected pages regardless of the order of the least significant bit LSB read operation and the most significant bit MSB read operation.

Figure 4:
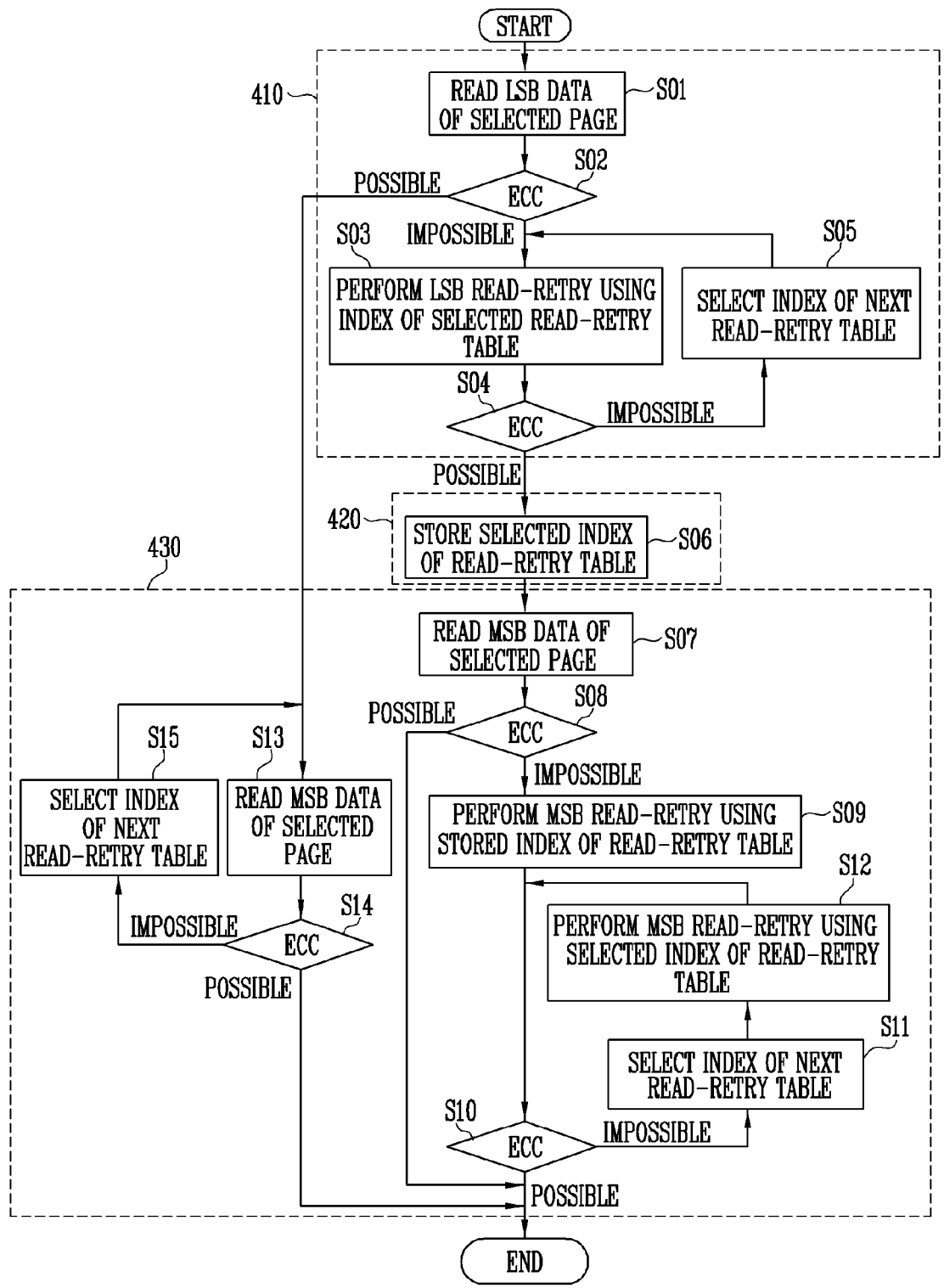
FIG. 4 is a sequence diagram illustrating a read operation according to an embodiment of the invention.
Figures 5, 6:
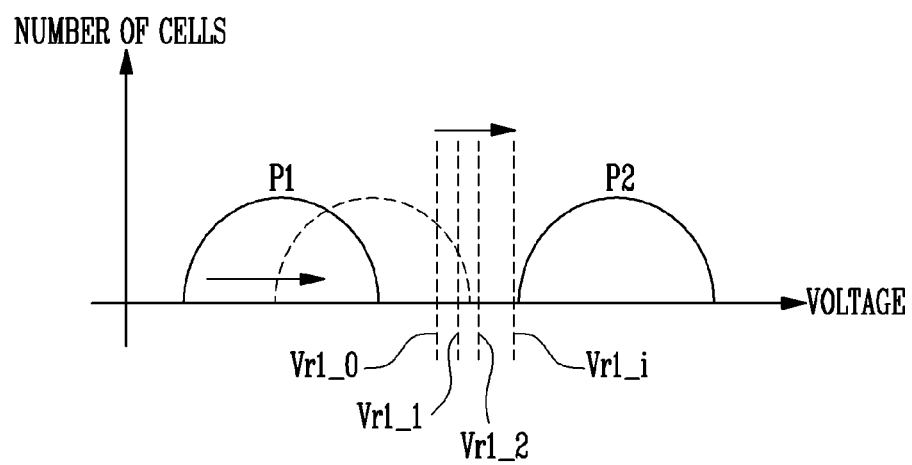
FIG. 5 is a view illustrating a read-retry table.
FIG. 6 is a view specifically illustrating a read-retry operation.

FIG. 4 is a sequence diagram illustrating a read operation according to an embodiment of the invention, and FIG. 5 is a view illustrating a read-retry table.

Referring to FIGS. 4 and 5, the read operation will be specifically described.

The read operation includes a step of performing an LSB read operation (410), a step of storing an index (420), and a step of performing an MSB read operation (430).

The step of performing an LSB read operation (410) includes a step of performing an LSB data read operation of a selected page (S01), a step of performing an error code correction (ECC) operation (S02), a step of performing an LSB read-retry operation using a selected read-retry table index (S03), a step of performing an ECC operation (S04), and a step of selecting a next read-retry table index (S05). Each step included in the step of performing the LSB read operation (410) will be specifically described below.

In an embodiment, a step of performing an LSB data read operation of a selected page (S01) may occur. The LSB read operation (410) may include performing a LSB read operation of a selected page while sequentially selecting LSB bit read voltages included in a LSB read-retry table until error correction of LSB read data is possible.

For an example of a multi level cell (MLC) in which a memory cell may be programmed in three program states, the memory cell may have an erase state, a first program state, a second program state, or a third program state depending on a threshold voltage. The first program state means a higher state of the threshold voltage than the erase state, the second program state means a higher state of the threshold voltage than the first program state, and the third program state means a higher state of the threshold voltage than the second program state. An LSB data read operation means a read operation using a voltage between the first and second program states as an LSB read voltage R2. When the LSB read operation is first performed, the LSB read voltage R2 is used with a predetermined initial LSB read voltage.

In an embodiment, a step of performing an ECC operation (S02) may occur.

When LSB data of a selected page is read (S01), the error correction circuit (122 of FIG. 1) detects an error included in the LSB data. In addition, the error correction circuit 122 may perform a LSB error detection operation and determine whether error correction is possible or not based on the number of detected errors, and transmit a possible signal or an impossible signal to the error control circuit (123 of FIG. 1). When it is determined that error correction is possible, the storing of the index may be omitted and an operation of reading MSB data of the selected page is performed (S13). The operation of reading MSB data of the selected page (S13) will be described later.

Further, in an embodiment, a step of performing an LSB read-retry operation using a selected read-retry table index (S03) may occur.

When error correction is impossible, the error control circuit 123 controls the peripheral circuits (130, 140 and 150 of FIG. 1) to perform the LSB read-retry operation using a voltage R2 of a selected index of the read-retry table (121 of FIG. 1) as an LSB read voltage. For example, the error control circuit 123 selects a zeroth index of the LSB read-retry table, and controls the peripheral circuits (130, 140 and 150 of FIG. 1) to perform the LSB read-retry operation using a voltage Vr2_0 corresponding to the selected zeroth index as the LSB read voltage. The voltage Vr2_0 corresponding to the zeroth index has a higher level than an initial LSB read voltage. When the LSB error correction is impossible, the LSB read-retry operation may be repeated while sequentially selecting indexes of a LSB read-retry table until the LSB error correction is possible. [Original paragraph 42 has been amended to provide explicit support for the third clause of claim 11.]

In an embodiment, a step of performing an ECC operation (S04) may occur.

When the LSB read-retry operation is performed and LSB data is read (S03), the error correction circuit 122 detects an error included in the LSB data, and determines whether error correction is possible or not based on the number of detected errors, and transmits a possible signal or an impossible signal to the error correction circuit 123.

In addition, in an embodiment, a step of selecting a next read-retry table index (S05) may occur.

When error correction is impossible and an impossible signal is transmitted to the error control circuit 123, the error control circuit 123 selects a next index of the read-retry table 121. For example, the zeroth index is selected in the previous LSB read-retry operation, and thus the error correction circuit 123 selects the first index as next. A voltage Vr2_1 corresponding to the first index has a higher level than the voltage Vr2_0 corresponding to the zeroth index.

An LSB read-retry operation is performed using the voltage Vr2_1 corresponding to the selected first index as an LSB read voltage (S03). Indexes of an LSB read-retry table are sequentially selected until error correction of the read LSB read data from the selected page is possible, and steps S03 to S05 are repeated. When error correction is possible as a result of performing the ECC operation (S04), a step of storing an index (420) is performed. The step of storing an index (420) includes a step of storing a selected read-retry table index (S06). The step of storing an index may correspond to a selected read voltage among the LSB read voltages when the error correction is possible.

In an embodiment, a step of storing a selected read-retry table index (S06) may occur.

When it is determined that ECC is possible (S04), an index when ECC is possible is stored. For example, in the step of performing the LSB read operation (410) described above, when it is determined that ECC is possible when the second index of the LSB read-retry table is selected, the error control circuit 123 temporarily stores the second index in a storage unit in the semiconductor device 100. An index of the selected read-retry table is stored, and then an MSB read operation of a selected page is performed (430).

A step of performing the MSB read operation (430) includes a step of performing an MSB data read operation of a selected page (S07), a step of performing an ECC operation (S08), a step of performing an MSB read-retry operation using a stored read-retry table index (S09), a step of performing an ECC operation (S10), a step of selecting a next read-retry table index (S11), a step of performing an MSB read-retry operation using a selected read-retry table index (S12), a step of performing an MSB data read operation of a selected page (S13), a step of performing an ECC operation (S14), and a step of selecting a next read-retry table index (S15). Each step included in the step of performing the MSB read operation (430) will be specifically described below.

Further, a step of performing an MSB data read operation of a selected page (S07) may also occur.

The MSB data read operation means a read operation using a voltage R1 between erase and first program states, and a voltage R3 between second and third program states as MSB read voltages. The MSB read voltages are used with predetermined initial MSB read voltages. The MSB data read operation may including performing the MSB read operation of a selected page while sequentially selecting MSB bit read voltages corresponding to a stored index among MSB bit read voltages included in a MSB read-retry table until error correction of MSB bit read data is possible.

In an embodiment, a step of performing an ECC operation (S08) may also occur.

When MSB data of the selected page is read (S07), the error correction circuit 122 detects an error included in the MSB data. In addition, the error correction circuit 122 determines whether error correction is possible or not based on the number of detected errors, and then transmits a possible signal or an impossible signal to the error control circuit 123. When it is determined that error correction is possible, a read operation of the selected page is finished.

In an embodiment, a step of performing an LSB read-retry operation using a selected read-retry table index (S09) may occur.

When error correction is impossible, the error control circuit 123 applies an index stored in step S06 to the MSB read-retry table 121, and controls the peripheral circuits 130, 140 and 150 to perform an MSB read-retry operation using such responding MSB read voltages. That is, when the MSB read-retry operation is started, the zeroth index which is the first index of the MSB read-retry table is not selected, but a index stored in the LSB read-retry operation is selected. For example, when the second index is stored in the LSB read-retry operation, the second index of the MSB read-retry table is selected in the MSB read-retry operation, and the error control circuit 123 controls the peripheral circuit 150 to perform the MSB read-retry operation using voltages Vr1_2 and Vr3_2 corresponding to the selected second index as MSB read voltages. In the MSB read-retry operation, an index is selected based on a result of the LSB read-retry operation to reduce time of the MSB read-retry operation based on LSB information of the same page. That is, in an index when error correction is impossible in the LSB read-retry operation, it is highly likely that error correction is impossible in the MSB read-retry operation, and thus time of the MSB read-retry operation may be reduced by first selecting an index when ECC is possible in the LSB read-retry operation. Accordingly, when error correction is impossible, the MSB read-retry operation may be repeated while sequentially selecting from an index corresponding to the index stored in the LSB read operation among indexes of a MSB read-retry table until the MSB error correction is possible.

An MSB read-retry operation will be described below with reference to FIG. 6.

FIG. 6 is a view specifically illustrating a read-retry operation.

Referring to FIG. 6, MSB read-retry voltages Vr1_0~Vr1_i having various levels between first and second threshold voltage distributions P1 and P2 in different program states may be set. When the first threshold voltage distribution P1 is increased by interference, an error can occur even when a selected page using the voltage Vr1_0 corresponding to the zeroth index of the MSB read-retry table is read. Thus, as described above, a read voltage corresponding to a stored index is included in a area in which there is a high possibility of no error occurrence, and thus a read-retry operation in which the zeroth and first indexes are selected may be omitted. Thus, time of the MSB read-retry operation can be reduced.

Further, in an embodiment, a step of performing an ECC operation (S10) may occur.

When the MSB read-retry operation is performed and MSB data is read (S09), the error correction circuit 122 detects an error included in the MSB data, determines whether error correction is possible or not based on the number of detected errors, and transmits a possible signal or an impossible signal to the error control circuit 123.

In addition, a step of selecting a next read-retry table index (S11) may occur in an embodiment.

When error correction is impossible and an impossible signal is transmitted to the error control circuit 123, the error control circuit 123 selects a next index of the read-retry table 121. For example, the stored second index is selected in the previous MSB read-retry operation, and thus the error control circuit 123 selects the third index which is the next index. Voltages corresponding to the third index have a higher level than voltages Vr1_2 and Vr3_2 corresponding to the second index even in the MSB read-retry table.

In embodiment, a step of performing an MSB read-retry operation using a selected read-retry table index (S12) may occur.

The MSB read-retry operation is performed using voltages corresponding to a selected index as read voltages R1 and R3 (S12). An index of the MSB read-retry table is sequentially selected until error correction of MSB read data read from a selected page is possible, and steps S10 to S12 are repeated. It is determined that ECC is possible in step S10, and the read operation of the selected page is finished.

When it is determined that error correction of the LSB read operation is possible in step S02, a step of performing the MSB data read operation of a selected page (S13) is performed. It will be described specifically below.

Further, in an embodiment, a step of performing an MSB data read operation of a selected page (S13) may occur.

The MSB data read operation of a selected page means a read operation using a voltage R1 between the erase and first program states, and a voltage R3 between the second and third program states as MSB read voltages. The MSB read voltages are used with predetermined initial read voltages. The MSB read operation of a selected page is performed using the initial MSB read voltages.

In an embodiment, a step of performing an ECC operation (S14) may occur.

When the MSB read-retry operation is performed and MSB data is read (S13), the error correction circuit 122 detects an error included in the LSB data, determines whether error correction is possible or not based on the number of detected errors, and transmits a possible signal and an impossible signal to the error control circuit 123. When error correction is determined as possible, the read operation of a selected page is finished.

In an embodiment, a step of selecting a next read-retry table index (S15) may be performed.

When error correction is determined as impossible and an impossible signal is transmitted to the error control circuit 123, the error control circuit 123 selects an index of the read-retry table 121.

When step S15 is first performed, the zeroth index which is the first index of the MSB read-retry table is selected, and step S13 and an ECC operation (S14) are performed using voltages corresponding to a selected index. In this way, an index of the MSB read-retry table is sequentially selected until it is determined that error correction is possible in step S14, and steps S13 to S15 are repeated until error correction is possible.

Figure 7:
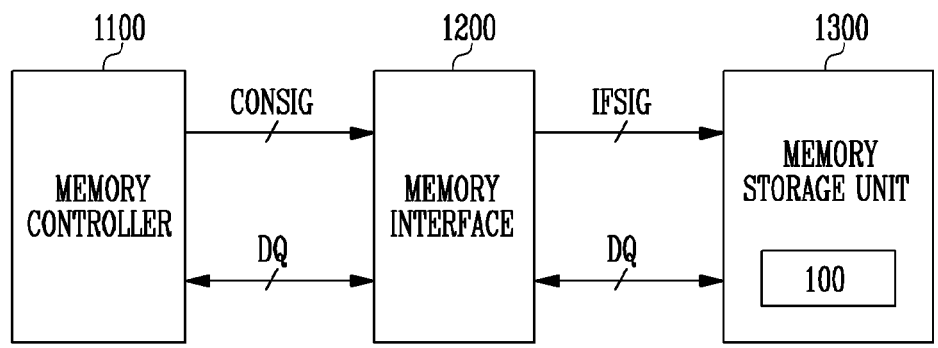
FIG. 7 is a block diagram illustrating a memory system including a semiconductor device according to an embodiment of the invention.

FIG. 7 is a block diagram illustrating a memory system including a semiconductor device according to an embodiment of the invention.

Referring to FIG. 7, a memory system 1000 may include a memory controller 1100, a memory interface 1200 and a memory storage unit 1300.

The memory controller 1100 responds to an external command input through a system bus, and transmits control signals CONSIG to the memory interface 1200 through a plurality of pins. For example, the memory controller 1100 may transmit the control signals CONSIG to the memory interface 1200 through address pins, a chip enable signal pin, a select signal pin, an output enable signal pin, a reset signal pin, a write enable signal pin, a write protect signal pin, a clock signal pin and an address available input signal pin. In addition, the memory controller 1100 may exchange data DQ with the memory interface 1200 through data pins.

The memory interface 1200 transmits interface signals IFSIG including in a command signal and an address to the memory storage unit 1300 in response to the control signals CONSIG, and may exchange the data DQ with the memory storage unit 1300.

The memory storage unit 1300 may include a semiconductor device 100 to store data. The semiconductor device 100 performs a program, and read and erase operations in response to the interface signals IFSIG. In particular, the semiconductor device 100 may include a control circuit configured to store in the read operation, an index in which error correction is possible in the LSB read-retry operation of a selected page stored in the semiconductor device 100 and used as a read voltage in the MSB read-retry operation of the same page. Accordingly, time of the read operation can be reduced. The control circuit may also be configured to first select an index of the MSB read-retry table corresponding to the stored index in a MSB read-retry operation of the selected page. Thus, operation time of the memory controller 1300 including the semiconductor device 100 having reduced operation time is reduced, time of the read operation may also be reduced, and operation time of a memory system including the memory controller 1300 may also be reduced.

Figure 8:
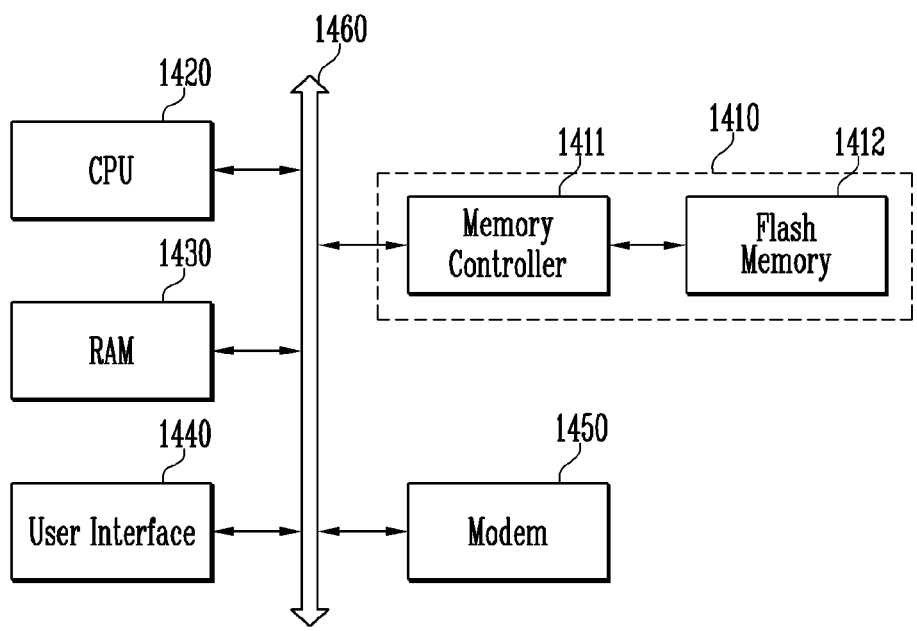
FIG. 8 is a schematic block diagram of a computing system according to an embodiment of the invention.

Referring to FIG. 8, a computing system 1400 may include a microprocessor (CPU) 1420, random-access memory (RAM), 1430, a user interface 1440, a modem 1450, such as a baseband chipset, and a memory system 1410 (as in FIG. 7) that are electrically coupled to a system bus 1460. In addition, if the computing system 1400 is mobile device, then a batter may be additional provided to apply an operation voltage to the computing system 1400. The computing system 1400 may further include application chipsets, a camera image processor (CIS), or a mobile dynamic random-access memory (DRAM). The memory system 1410 may include a flash memory device 1412. The memory system 1410 may form a solid state drive/disk (SSD) that uses a non-volatile memory to store data.

According to the invention, read operation times of a semiconductor device and a memory system can be reduced while improving reliability of a read operation.

In the drawings and specification, there have been disclosed typical embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the invention as defined by the following claims.

What is claimed is:

1. A semiconductor device, comprising:
a plurality of memory blocks including a plurality of pages;
peripheral circuits configured to perform a least significant bit read operation and a most significant bit read operation of a selected page included in a selected block; and
a control circuit including a least significant bit read-retry table and a most significant bit read-retry table which have a plurality of indexes, and configured to control the peripheral circuits to store an index used when error correction is possible among the least significant bit read-retry table in the least significant bit read operation and perform the most significant bit read operation by first selecting the stored index among the most significant bit read-retry table.

2. The semiconductor device of claim 1, wherein the indexes of the least significant bit read-retry table are configured with different least significant bit read voltages; and the indexes of the most significant bit read-retry table are configured with different most significant bit read voltages.

3. The semiconductor device of claim 1, wherein the control circuit further includes:
an error correction circuit configured to detect a read error included in read data and correct the error; and
an error control circuit configured to select an index of the least significant bit read-retry table or the most significant bit read-retry table of the selected page in response to a signal output from the error correction circuit and perform the least significant bit read operation or the most significant bit read operation using the least significant bit read voltage or the most significant bit read voltage corresponding to the selected index.

4. The semiconductor device of claim 1, wherein each of the peripheral circuits further includes:
a voltage generation circuit configured to generate a read voltage and a read pass voltage in response to a read operation signal output from the control circuit;
a row decoder configured to select a memory block among the memory blocks in response to row control signals output from the control circuit, and transmit the read voltage and the read pass voltage to word lines of the selected memory block; and
a column decoder configured to exchange data with the selected memory block through bit lines coupled to the selected memory block in response to a column control signal output from the control circuit.

5. A memory system, comprising:
a memory controller configured to output control signals through a plurality of pins;
a memory interface configured to output interface signals including a command signal and an address; and
a memory storage unit including a semiconductor device in which data is stored,
wherein the semiconductor device includes a control circuit configured to store an index when error correction is possible in a least significant bit read operation, and first select an index of a most significant bit read-retry table corresponding to the stored index in a most significant bit read operation.

6. The memory system of claim 5, wherein the memory controller transmits the control signals to the memory interface through the plurality of pins which include address pins, a chip enable signal pin, a select signal pin, an output enable signal pin, a reset signal pin, a write enable signal pin, a write protect signal pin, a clock signal pin, and an address available input signal pin.

7. The memory system of claim 5, wherein the semiconductor device includes:
a plurality of memory blocks including a plurality of pages;
peripheral circuits configured to perform a least significant bit read operation and a most significant bit read operation of a selected page which are included in a selected memory block among the memory blocks; and
a control circuit including a least significant bit read-retry table and a most significant bit read-retry table which have a plurality of indexes configured with various read voltages, and configured to control the peripheral circuits to store an index used when error correction is possible among the indexes of the least significant bit read-retry table in the least significant bit read operation and perform the most significant bit read operation by first selecting an index corresponding to the stored index among the indexes of the most significant bit read-retry table.

8. The memory system of claim 7, wherein the indexes of the least significant bit read-retry table are configured with different least significant bit read voltages; and the indexes of the most significant bit read-retry table are configured with different most significant bit read voltages.

9. The memory system of claim 7, wherein the control circuit further includes:

an error correction circuit configured to detect a read error included in the read data, and correct the error; and an error control circuit configured to select an index of the least significant bit read-retry table or the most significant bit read-retry table of the selected page in response to a signal output from the error correction circuit, and perform the least significant bit read operation or the most significant bit read operation using the least significant bit read voltage or the most significant bit read voltage corresponding to the selected index.

10. An operating method of a semiconductor device, comprising;

performing a least significant bit read operation while selecting least significant bit read voltages included in a least significant bit read-retry table until error correction of least significant bit read data is possible;

storing an index among the least significant bit read voltages when the error correction is possible; and performing a most significant bit read operation while selecting most significant bit read voltages corresponding to the stored index among a most significant bit read-retry table until error correction of most significant bit read data is possible.

11. The operating method of 10, wherein the least significant bit read operation further includes:

reading a least significant bit data of a selected page;

detecting an error of least significant bit data included in the least significant bit data, and performing a least significant bit error detect operation to determine whether least significant bit error correction is possible based on the number of errors of the detected least significant bit data; and repeating a least significant bit read-retry operation while sequentially selecting indexes of the least significant bit read-retry table until the least significant bit error correction is possible when the least significant bit error correction is impossible.

12. The operating method of claim 11, wherein indexes of the least significant bit read-retry table correspond to different least significant bit read voltages.

13. The operating method of claim 11, wherein a first index of the least significant bit read-retry table is first selected in the least significant bit read-retry operation.

14. The operating method of claim 11, wherein, when the least significant bit error detect operation is first performed and the least significant bit error correction is determined as possible, the storing of the index is omitted and the most significant bit read operation is performed.

15. The operating method of claim 10, wherein the most significant bit read operation further includes:

reading most significant bit data of the selected page;

detecting a most significant bit error included in the most significant bit data, and determining whether most significant bit error correction is possible based on the number of detected most significant bit errors; and repeating a most significant bit read-retry operation while sequentially selecting from an index corresponding to an index stored in the least significant bit read operation among indexes of a most significant bit read-retry table until the high-bit error correction is possible, when the most significant bit error correction is impossible.

* * * * *